United States Patent
Andreev et al.

(10) Patent No.: US 7,036,102 B2
(45) Date of Patent: Apr. 25, 2006

(54) PROCESS AND APPARATUS FOR PLACEMENT OF CELLS IN AN IC DURING FLOORPLAN CREATION

(75) Inventors: Alexander E. Andreev, San Jose, CA (US); Andrey A. Nikitin, Moscow (RU); Igor A. Vikhliantsev, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 124 days.

(21) Appl. No.: 10/694,208

(22) Filed: Oct. 27, 2003

(65) Prior Publication Data

US 2005/0091625 A1    Apr. 28, 2005

(51) Int. Cl.
G06F 17/50    (2006.01)
(52) U.S. Cl. .................. 716/7; 716/9; 716/10
(58) Field of Classification Search ............... 716/7–14
See application file for complete search history.

(56) References Cited

U.S. PATENT DOCUMENTS

| | | | |
|---|---|---|---|
| 5,535,134 A | 7/1996 | Cohn et al. | |
| 6,014,506 A | 1/2000 | Hossain et al. | |
| 6,134,702 A * | 10/2000 | Scepanovic et al. | 716/10 |
| 6,189,132 B1 | 2/2001 | Heng et al. | |
| 6,292,929 B1 * | 9/2001 | Scepanovic et al. | 716/14 |
| 6,415,425 B1 | 7/2002 | Chaudhary et al. | |
| 6,637,016 B1 | 10/2003 | Gasanov et al. | |
| 6,650,046 B1 | 11/2003 | Shirakawa et al. | |
| 6,748,574 B1 * | 6/2004 | Sasagawa et al. | 716/9 |
| 2003/0163795 A1 | 8/2003 | Morgan et al. | |
| 2003/0188274 A1 | 10/2003 | Gasanov et al. | |
| 2004/0166864 A1 | 8/2004 | Hill et al. | |
| 2005/0038728 A1 | 2/2005 | La Mura | |
| 2005/0091625 A1 | 4/2005 | Andreev et al. | |

* cited by examiner

*Primary Examiner*—Paul Dinh
(74) *Attorney, Agent, or Firm*—Westman, Champlin & Kelly

(57) ABSTRACT

Objects are placed in a rectangle and their coordinates of the objects and are adjusted to establish a substantially uniform density of objects in the rectangle. The evaluation of coordinates is performed by placing the wires between cells coordinates and adjusting the cell coordinates to connect the cells to the wires. The substantially uniform density is achieved by dividing the rectangle into first and second rectangles having equal free areas and into third and fourth rectangles having equal areas of objects. The coordinates of the objects are adjusted based on boundaries between the first and second rectangles and between the third and fourth rectangles.

17 Claims, 3 Drawing Sheets

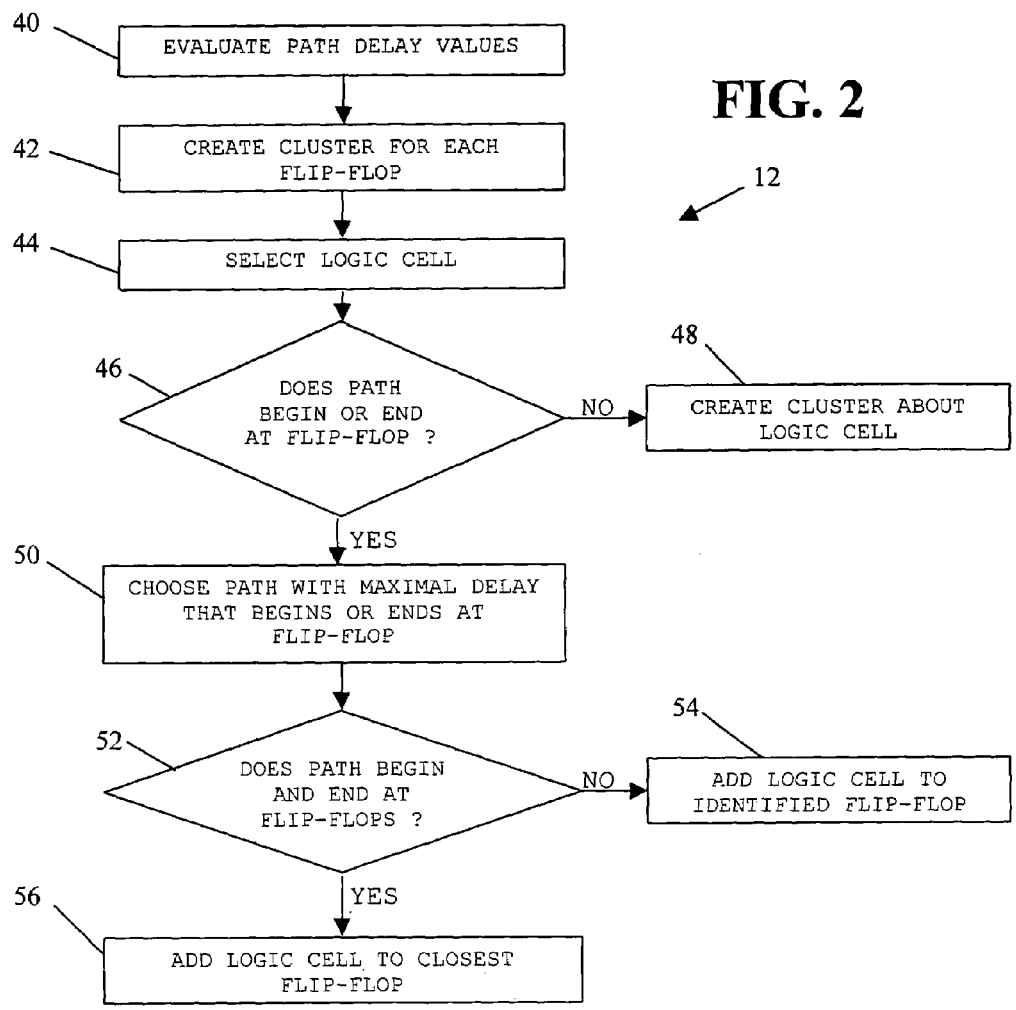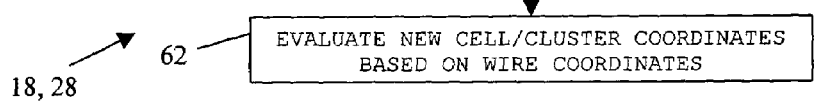

PROCESS AND APPARATUS FOR PLACEMENT OF CELLS IN AN IC DURING FLOORPLAN CREATION

FIELD OF THE INVENTION

This invention relates to design of integrated circuits (ICs), and particularly to cell placement during floorplan creation.

BACKGROUND OF THE INVENTION

The placement of cells in an IC chip design during development can be summarized as encompassing three stages: During a first stage, the size of the chip is selected and the I/O (input/output) cells are placed. The I/O cells are the cells having pins that connect the chip to the outside world. During a second stage, placement of megacells (such as memories, large blocks of cells, etc.) is accomplished. The third stage comprises the placement of all other cells, such as logic cells, flip-flops, latches, etc. The first two stages are usually referred to as the floorplan development, and the third stage is often referred to as the placement stage.

Integrated circuits are used in a wide range electronic devices produced by a large number of device manufacturers. In practice, ICs are seldom manufactured (fabricated) by the electronic device manufacturer. Instead ICs are manufactured by an IC foundry to the specifications of the electronic device manufacturer. The design of the IC is usually the result of corroboration between the device manufacturer and the IC foundry. Hence, the device manufacturer is a customer to the foundry and the foundry develops the chip for the customer. The first stage of choosing the size of the chip and the placement of its I/O cells is usually performed by the customer to meet the customer's requirements of circuit form, fit and function. The second and third stages are performed by the developer, usually to meet the foundry's processes. In most cases the developer places the megacells manually in accordance with its own heuristic suggestions. Then the developer finishes the process of chip creation using computer tools.

Upon completion of the chip design, the developer decides whether the chip design is acceptable; that is, whether it satisfies certain specifications, such as timing, etc. If it does not, the designer returns to the second stage, remakes the floorplan, and repeats the process until a suitable chip is obtained.

One criterion for determined whether or not a chip design is acceptable is based on the presence or absence of timing violations. The present invention is directed to a process, and to a computer program that causes a computer to carry out the process, for placing megacells during creation of the floorplan to satisfy timing requirements.

SUMMARY OF THE INVENTION

In a first embodiment of the invention, objects are placed in a rectangle. The coordinates of the objects are evaluated and are adjusted to establish a substantially uniform density of objects in the rectangle.

In some embodiments, the evaluation of coordinates is performed by evaluating coordinates of all wires connected to the cells and evaluating cell coordinates based on the wire coordinates. In some embodiments, the wires are placed between cells coordinates and the cell coordinates are then adjusted to connect the cells to the wires.

In other embodiments, the adjustment of the coordinates is performed by dividing the rectangle into first and second rectangles having equal free areas. The rectangle is separately divided into third and fourth rectangles having equal areas of objects. The coordinates of the objects are adjusted based on boundaries between the first and second rectangles and between the third and fourth rectangles.

In other embodiments, the objects are standard cells and megacells of an integrated circuit. Clusters of standard cells are created by creating a cluster for each flip-flop cell, creating a cluster for each logic cell in a path that does not terminate at a flip-flop cell, and assigning each logic cell in a path that terminates at a flip-flip cell to the cluster of a flip-flop cell at the termination of the respective path.

A second embodiment of the present invention is a computer readable program containing computer readable code that causes a computer to perform the above process.

BRIEF DESCRIPTION OF THE DRAWINGS

FIGS. 2–4 are flowcharts of portions of the process shown in FIG. 1.

DETAILED DESCRIPTION OF THE PREFERRED EMBODIMENTS

The present invention is directed to a process and computer program that places cells, particularly megacells, during floorplan creation to satisfy timing restrictions. More particularly, cells in paths with large delays are differentiated from cells in paths with small delays. The cells in paths with large delays are identified as the most critical cells. If several cells belong to one path with a large delay, these cells are placed as close to each other as possible, thus reducing the lengths of wires that connect these cells. Vice versa, plural cells belonging to a path with a small delay may be placed at large distances from each other.

For purposes of explanation of the invention, consider a chip that contains I/O cells, megacells, flip-flops and logic cells. Assume further that the chip has a rectangular configuration and contains blockages, which are rectangular fragments of the chip where cells may not be placed. Assume too that all the I/O cells are already placed and are fixed on respective positions on the chip. The area of the chip that is not covered by any blockage or a fixed cell is referred to as a free area, and is available for cell placement. The flip-flops and logic cells are sometimes herein referred to as standard cells.

Figure 1:
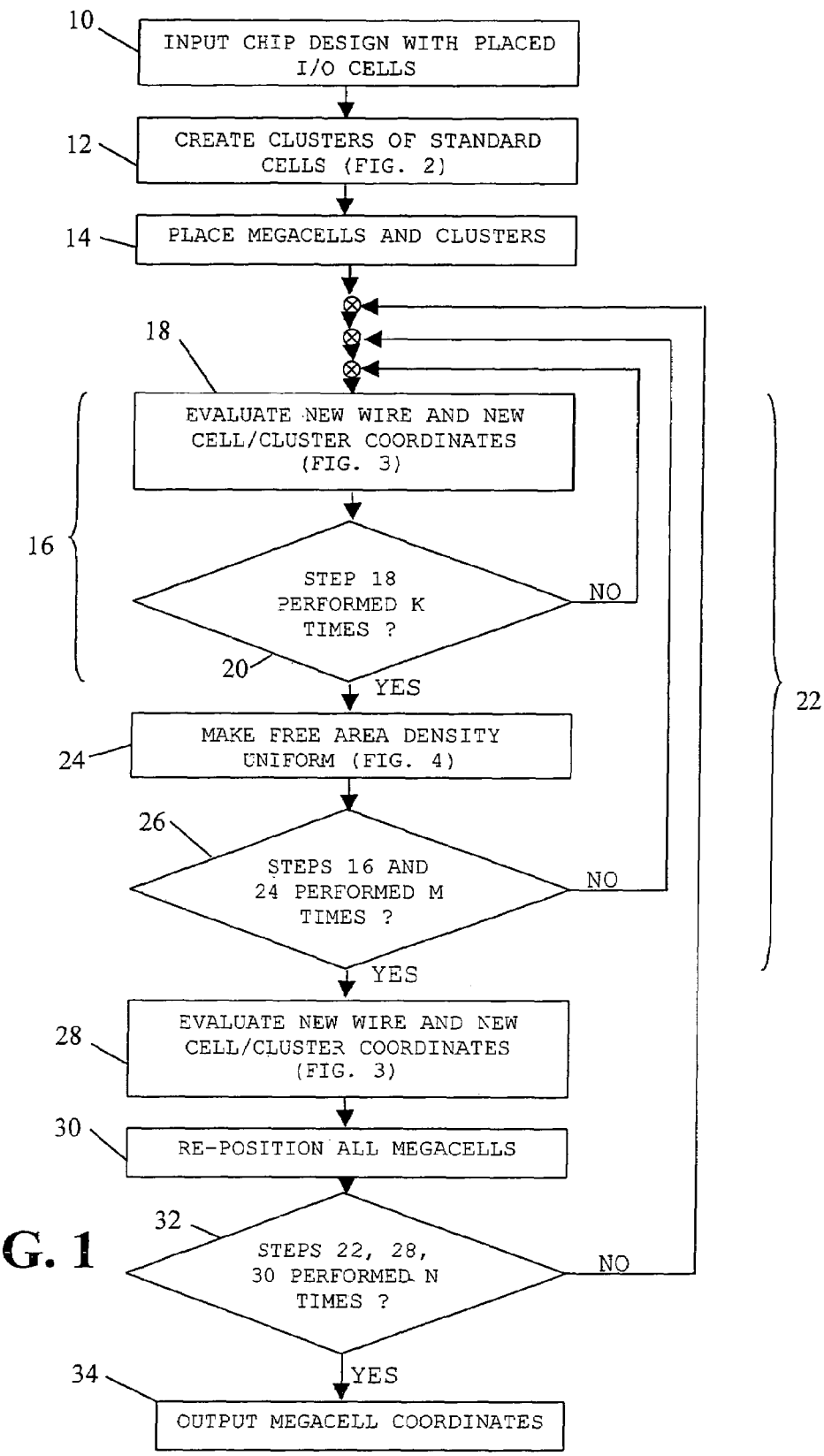
FIG. 1 is a flowchart of a process for cell placement according to an embodiment of the present invention.

FIG. 1 is a flowchart of a process of placement of cells or megacells in accordance with a preferred embodiment of the present invention. At step 10, the chip design is input to the computer system. Preferably, the chip design has already completed the first stage of the floorplan creation and includes placed I/O cells. Only I/O cells are fixed in place. Therefore, only the megacells and standard cells that are not I/O cells are not fixed at this point. Additionally, the values of K, M and N are input into the computer for use in connection with the process, to be explained.

At step 12, clusters of standard cells are created. FIG. 2 is a detailed flowchart of step 12. Most of the cells in a chip are standard, composed of logic cells and flip-flops. As will be more fully understood hereinafter, the process does not consider standard cells separately. Instead, the present invention deals with clusters of standard cells composed of one or several standard cells (logic cells and flip-flops). Because the number of clusters of the standard cells is significantly less than the total number of standard cells in the chip, the process of megacell placement in accordance with the present invention can be accelerated.

Referring to FIG. 2, at step 40, the values of delays of each of the paths of the chip are evaluated. In the initial iteration of the process, there may not be any values to evaluate since there has been no chip placement. In such a case, values of delays in average cases can be employed, and modified as the placement continues. At step 42 a cluster is created for each flip-flop. At step 44 a logic cell is selected.

The remainder of the process of FIG. 2 concerns the decision as to whether to add the logic cell to an existing cluster, or create a new cluster for the cell. This part of the process begins at step 46 that identifies the timing paths that contains the logic cell. Particularly, if at step 46 there is no path that begins or ends on a flip-flop cell, then at step 48 a new cluster is created about the logic cell. If at step 46 a path exists containing the logic cell that begins or ends at a flip-flop, then at step 50 the path is selected that begins or ends at a flip-flop and that has the maximal delay.

At step 52, if the path containing maximal delay does not begin and end at respective flip-flops (i.e., both ends of the maximal delay path are not flip-flops, so the decision at step 52 is "no"), then at step 54 the logic cell is added to the cluster of the one identified flip-flop. Otherwise, if both paths terminate at flip-flops at step 52 (the decision at step 52 is "yes"), then at step 56 the logic cell is added to the cluster of the closest flip-flop. A logic cell is "close" to a flip-flop cell if the value of the delay of the path fragment between the logic cell and one terminating flip-flop cell is smaller than the delay value of the other path fragment to the other terminating flip-flop cell.

Returning to FIG. 1, at step 14, all megacells and clusters of standard cells are placed at the center of the chip. At loop 16 the coordinates of the wires and cell/clusters are evaluated. More particularly, at step 18, new wire and new cell/cluster coordinates are evaluated as more fully described in association with FIG. 3.

As shown in FIG. 3, at step 60 the pins $P_1, P_2, \ldots, P_s$ of the megacells, the I/O cells and the standard cell clusters that are connected to each wire W are evaluated. For a given pin $P_i$ having coordinates $(x_i, y_i)$ new coordinates are assigned to the wire W as follows:

$$x = \frac{1}{S}\sum_{i=1}^{S} x_i \quad y = \frac{1}{S}\sum_{i=1}^{S} y_i$$

This means that wire W is placed between the pins that are connected to this wire. It will be appreciated that wires do not ordinarily actually have coordinates of their own. Instead, the term "coordinates of wires" is used herein to simplify the explanation of the process.

At step 62, the cell/cluster coordinates are evaluated based on wire coordinates. More particularly, new coordinates of cells and clusters of the standard cells are evaluated based on the coordinates of wires that are connected to its pins. This step is applied to all standard cells and to megacells that are not fixed. This step is not applied to cells whose positions are fixed, namely I/O cells and fixed megacells.

Consider some cell or cluster of the standard cells having wires $W_1, W_2, \ldots, W_t$ connected to the pins of the cell/cluster. The coordinates of wire $W_i$ are $(x_i, y_i)$ and maximal delay of the path that contains wire $W_i$ is $D_i$. New coordinates of the cell/cluster are calculated as follows:

$$x = \left(\sum_{i=1}^{t} D_i x_i\right) \Big/ \left(\sum_{i=1}^{t} D_i\right) \quad y = \left(\sum_{i=1}^{t} D_i y_i\right) \Big/ \left(\sum_{i=1}^{t} D_i\right)$$

Note that moving the cell/cluster takes into account the delay values; the greater the delay value of the path that contains the wire $W_i$, the closer the new coordinates of the cell/cluster are to the coordinates of the wire $W_i$.

Returning to FIG. 1, at step 20, a decision is made as to whether step 18 has been performed K times. If not, the process loops back to step 18 and repeats the evaluation of wire and cells/cluster coordinates described in connection with FIG. 3 until performed K number of times.

Another loop 22 is formed that includes steps 24 and 26. Step 24 adjusts the free area density so that it is substantially uniform across the chip. Step 24 is described in greater detail in association with FIG. 4, and may be explained with reference to FIG. 5.

After re-calculation of cell coordinates at loop 16, the cells may become distributed non-uniformly across the chip. This means that some fragments of the chip may be empty, having no cells, whereas other fragments may be densely packed. The process of FIG. 4 executes movements of the cells and clusters, but does not change the relative positions of the cells and clusters. If a cell/cluster is to a given side of another cell/cluster before applying the process of FIG. 4, that same relative position is retained on execution of the process of FIG. 4.

Figure 4:
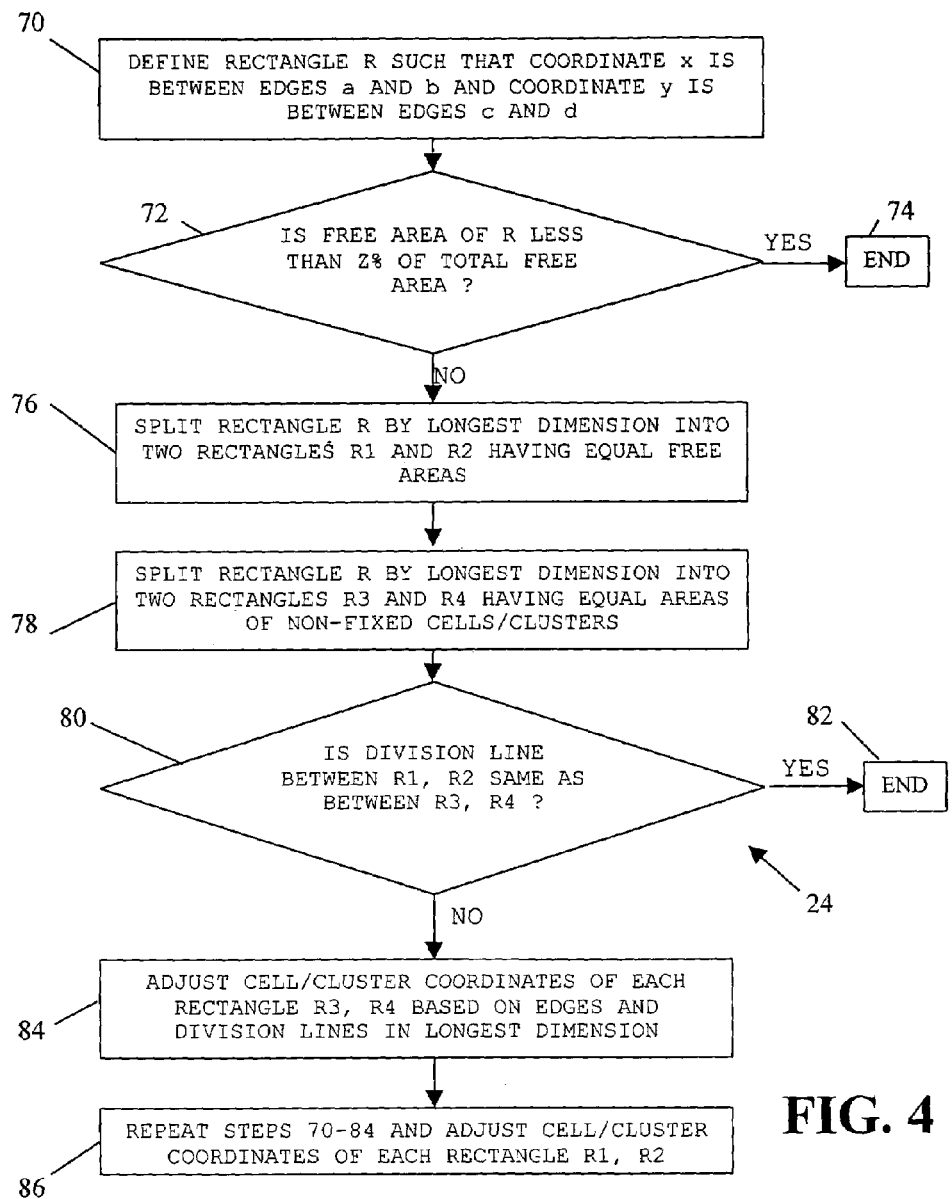

The process of FIG. 4 is a binary recursive algorithm. Shown in FIG. 4 is the procedure UNIFORM_DENSITY (R), where R is some rectangular fragment of the chip. The same algorithm is applied to the entirety of the chip and is designated UNIFORM_DENSITY(total chip).

Figure 5:
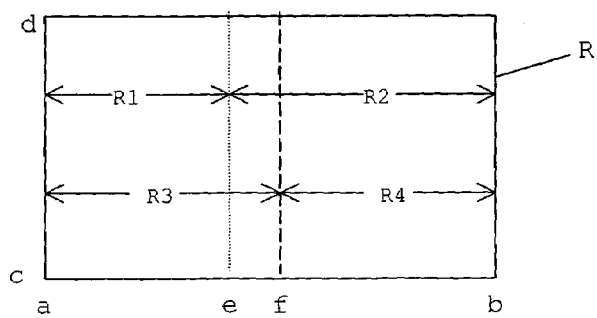
FIG. 5 is a diagram useful in explaining a distribution of cells used in the present invention.

At step 70, a rectangle R is defined (shown in FIG. 5) having left and right edges a and b and bottom and top edges c and d. Coordinates x and y lie in rectangle R such that $a \leq x \leq b$ and $c \leq y \leq d$. At step 72, if the free area of rectangle R is less than some minimum, for example 0.1%, of the total area of the chip, the process ends at step 74 and rectangle R is considered as having substantially uniform density distribution. If the free area of rectangle R is greater than the threshold minimum, the process continues to step 76 where rectangle R is divided by its longest dimension into two rectangles R1 and R1 having equal free areas. The example of FIGS. 4 and 5 is of a rectangle whose greatest dimension is horizontal, rather than vertical. Thus, $(b-a) \geq (d-c)$. Consequently, rectangle R is divided vertically at line e to form rectangles R1 and R2 which are not necessarily the same physical size but they are equal in free area.

R1={$a \leq x \leq e, c \leq y \leq d$}, R2={$e \leq x \leq b, c \leq y \leq d$}.

(In the case $(b-a) \leq (d-c)$ the vertical dimension of rectangle R will be greater than the horizontal dimension, in which case the rectangle will be split horizontally into rectangles R1 and R2 that are oriented vertically to each other. The process would then be carried out in the same manner herein described, exchanging the coordinates x and y.)

At step 78, rectangle R is split into two rectangles R3 and R4 by a vertical line f such that the area of not-fixed cells and clusters in rectangle R3 is equal to the area of not-fixed cells and clusters in rectangle R4.

R3={$a \leq x \leq f, c \leq y \leq d$}, R4={$f \leq x \leq b, c \leq y \leq d$}.

Again, the physical sizes of rectangles R3 and R4 are not necessarily the same; they only contain the same areas of non-fixed cells and clusters.

At step 80, if e=f, then the density of non-fixed cells and clusters is substantially uniform though the long dimension of rectangle R (between a and b in the example), and at step 82 the process of FIG. 4 ends. If e≠f, as shown in FIG. 5, there is an unequal distribution of non-fixed cells and clusters in the long dimension across rectangle R. Consequently, at step 84 the cell/cluster coordinates of each rectangle R3 and R4 is adjusted based on the values of the rectangle edges a and b and the division lines e and f. More particularly, the x coordinate of each cell/cluster of rectangle R3 is changed as $$x = a + \frac{(e-a)}{(f-a)}(x-a)$$

and the x component of each cell/cluster of rectangle R4 is changed as $$x = b - \frac{(b-e)}{(b-f)}(b-x).$$

At step 86, the procedure of steps 70–84 is repeated, using rectangles R1 and R2.

Optionally, the procedure of FIG. 4 is repeated for the short dimension of rectangle R. In the example, the y coordinates of cells/clusters are thus adjusted.

Returning again to FIG. 1, at step 26, a decision is made as to whether loop 16 and step 24 have been performed M number of times. If not, the process loops back to step 18 to repeat step 18 K number of times, then perform another step 24 to make the free area density uniform, repeating the process M number of times. Once the loop 22, including the K sub-loop 16 have been performed M times at step 26, then at step 28 the new wire and new cell/cluster coordinates are evaluated.

More particularly, with reference to FIG. 3, the process of step 28 evaluates new wire coordinates based on cell coordinates as described at step 60 in FIG. 3. However, step 62 is slightly different in that at step 28 the evaluation of new cell coordinates based on wire coordinates is applied to all megacells rather than clusters of standard cells and non-fixed megacells as was done in step 18. Otherwise, step 62 of step 26 is the same as previously described.

At step 30, all megacells that had been previously fixed are unfixed, and the megacells are placed in the coordinates that were evaluated at step 28. The megacells are then fixed to their new positions.

At step 32 a decision is made as to whether loop 22, including sub-loop 16 and steps 28 and 30 have been performed N number of times. If not, the process returns to step 18, re-iterating through loop 16 K number times, iterating through loop 22 M number of times until N iterations have been completed at step 32. Then at step 34, the megacell coordinates are output.

The present invention provides a process for placing megacells, such as memories, in chips. In one embodiment, the parameters N=10, M=5, K=2 were found to be quite satisfactory. The process finds "most attractive" coordinates for placement of megacells. However, in some cases the found coordinates may violate certain design rules of the fabrication technology. In such a case, it may be necessary to subsequently apply tools for legal placement of the megacells that is close to the "most attractive" coordinates obtained by the present process. Such tools to accomplish legal placement are well known in the art.

In preferred embodiments, the process is carried out by a computer employing a computer program comprising computer readable program code recorded or embedded on a computer-readable medium, such as a recording disk or other readable device.

Although the present invention has been described with reference to preferred embodiments, workers skilled in the art will recognize that changes may be made in form and detail without departing from the spirit and scope of the invention.

What is claimed is:

1. A process of placing objects, including flip-flop cells and logic cells, in a rectangle comprising steps of:
   a) obtaining approximate delays for paths in a design;
   b) creating clusters of logic cells and flip-flop cells, comprising:
      b1) creating a cluster for each flip-flop cell,
      b2) creating a cluster for each logic cell for which there is no path that comprises the logic cell and begins or ends at a flip-flop cell, and
      b3) for each logic cell for which there is at least one path, including a longest path, that comprises the logic cell and begins or ends at a flip-flop cell, assigning the logic cell to the cluster of either the flip-flop cell at which the longest path begins or ends; and
   c) placing the clusters in the rectangle.

2. The process of claim 1,
   d) evaluating coordinates of the clusters; and
   e) adjusting the coordinates of the clusters to establish a substantially uniform density of objects clusters in the rectangle.

3. The process of claim 2, further comprising:
   f) after step e), evaluating coordinates of the clusters, and
   g) re-positioning at least one of the clusters.

4. The process of claim 3, wherein the objects include fixed objects and non-fixed objects, and step d) is applied to non-fixed objects and step f) is applied to fixed and non-fixed objects.

5. The process of claim 2, wherein the objects include fixed objects and non-fixed objects, and step d) is applied to non-fixed objects.

6. The process of claim 2, wherein the objects include wires and cells connected by wires and step d) comprises:
   d1) evaluating wire coordinates based on cell coordinates, and
   d2) evaluating cell coordinates based on wire coordinates.

7. The process of claim 2, wherein the objects include wires and cells connected by wires and step d) comprises:
   d1) assigning wires to positions between cells to which the respective wire is connected, and
   d2) assigning new cell coordinates to connect the cells to their respective wires.

8. The process of claim 2, wherein step e) comprises:
   e1) dividing the rectangle into first and second rectangles having equal free areas,
   e2) dividing the rectangle into third and fourth rectangles having equal areas of objects, and
   e3) adjusting coordinates of the clusters based on boundaries between the first and second rectangles and between the third and fourth rectangles.

9. The process of claim 1, wherein step b3 comprises:
if the longest path begins and ends at respective flip-flop cells, assigning the corresponding logic cell to the cluster of the flip-flop cell closest to the logic cell, and
if the longest path begins or ends, but not both, at a flip-flop cell, assigning the corresponding logic cell to the cluster of the flip-flop cell.

10. A process of creating a substantially uniform density of clusters in a rectangle comprising steps of:
 a) obtaining approximate delays for paths in a design;
 b) creating clusters of logic cells and flip-flop cells, comprising:
  b1) creating a cluster for each flip-flop cell,
  b2) creating a cluster for each logic cell for which there is no path that comprises the logic cell and begins or ends at a flip-flop cell, and
  b3) for each logic cell for which there is at least one path, including a longest path, that comprises the logic cell and begins or ends at a flip-flop cell, assigning the logic cell to the cluster of either the flip-flop cell at which the longest path begins or ends;
 c) placing the clusters in the rectangle,
 d) dividing the rectangle into first and second rectangles having equal free areas,
 e) dividing the rectangle into third and fourth rectangles having equal areas of clusters, and
 f) adjusting coordinates of the clusters based on boundaries between the first and second rectangles and between the third and fourth rectangles.

11. A computer usable medium having a computer readable program embodied therein for addressing data to place representations of objects, including logic cells and flip-flop cells in a representation of a rectangle, the computer readable program comprising:
 first computer readable program code comprising:
  computer readable program code for creating a cluster for each flip-flop cell,
  computer readable program code for creating a cluster for each logic cell for which there is no path that comprises the logic cell and begins or ends at a flip-flop cell, and
  computer readable program code for assigning each logic cell for which there is at least one path, including a longest path, that comprises the logic cell and begins or ends at a flip-flop cell, to the cluster of either the flip-flop cell at which the longest path begins or ends;
 second computer readable program code for causing the computer to place representations of the clusters in the representation of the rectangle;
 third computer readable program code for causing the computer to evaluate coordinates of the clusters;
 fourth computer readable program code for causing the computer to adjust the coordinates of the clusters to establish a substantially uniform density of representations of clusters in the representation of the rectangle.

12. The computer usable medium of claim 11, further comprising:
 fifth computer readable program code for causing the computer to evaluate the adjusted coordinates of the clusters, and
 sixth computer readable program code for causing the computer to re-position the representations of the clusters.

13. The computer usable medium of claim 12, wherein the objects include fixed objects and non-fixed objects, and the third computer readable program code is applied to representations of non-fixed objects and the fifth computer readable program code is applied to representations of fixed and non-fixed objects.

14. The computer usable medium of claim 11, wherein the objects include fixed objects and non-fixed objects, and the third computer readable program code is applied to representations of non-fixed objects.

15. The computer usable medium of claim 11, wherein the objects include wires and cells connected by wires and the third computer readable program code comprises:
 computer readable program code for causing the computer to evaluate wire coordinates based on cluster coordinates, and
 computer readable program code for causing the computer to evaluate cluster coordinates based on wire coordinates.

16. The computer usable medium of claim 11, wherein the fourth computer readable program code comprises:
 computer readable program code for causing the computer to divide the representation of the rectangle into representations of first and second rectangles having equal free areas,
 computer readable program code for causing the computer to divide the representation of the rectangle into representations of third and fourth rectangles having equal areas of clusters, and
 computer readable program code for causing the computer to adjust coordinates of the clusters based on boundaries between the representations of the first and second rectangles and between the representations of the third and fourth rectangles.

17. The computer usable medium of claim 11, wherein the first computer readable program code further comprises:
 computer readable program code for assigning the logic cell to the cluster of the flip-flop cell closest to the logic cell if the longest path begins and ends at respective flip-flop cells, and for assigning the logic cell to the cluster of the flip-flop cell if the longest path begins or ends, but not both, at a flip-flop cell.

* * * * *